(12) United States Patent
Kazama et al.

(10) Patent No.: US 7,918,543 B2
(45) Date of Patent: Apr. 5, 2011

(54) LIQUID JET HEAD AND AN ACTUATOR APPARATUS

(75) Inventors: Hironobu Kazama, Matsumoto (JP); Yuka Yonekura, Chino (JP); Koji Sumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 155 days.

(21) Appl. No.: 12/433,213

(22) Filed: Apr. 30, 2009

(65) Prior Publication Data

US 2009/0273654 A1    Nov. 5, 2009

(30) Foreign Application Priority Data

Apr. 30, 2008  (JP) .................. 2008-118898
Apr. 30, 2009  (JP) .................. 2009-110582

(51) Int. Cl.
*B41J 2/045* (2006.01)
(52) U.S. Cl. ........................................................ 347/68
(58) Field of Classification Search .................. 347/71, 347/70, 72, 68–69; 400/124.14, 124.16; 310/311, 324, 327, 365; 204/192.18; 427/100; 430/319
See application file for complete search history.

(56) References Cited

U.S. PATENT DOCUMENTS

| 6,103,072 | A | * | 8/2000 | Nishiwaki et al. | ....... 204/192.18 |
| 6,284,434 | B1 | * | 9/2001 | Kamei et al. | ................. 430/319 |
| 2006/0146097 | A1 | * | 7/2006 | Fujii et al. | ...................... 347/68 |

FOREIGN PATENT DOCUMENTS

JP    2006-278835    10/2006

* cited by examiner

*Primary Examiner* — K. Feggins
(74) *Attorney, Agent, or Firm* — Workman Nydegger

(57) ABSTRACT

A liquid jet head includes a flow passage forming substrate formed of a crystal substrate provided with a pressure generating chamber communicating with nozzle openings, and a piezoelectric element including a lower electrode, a piezoelectric layer, and an upper electrode, which are provided on the flow passage forming substrate to change pressure in the pressure generating chamber. The piezoelectric layer has a thickness of 5 μm or less and is formed of perovskite type crystals, and the distance between a diffraction peak position A of an X-ray derived from a surface (220) of the flow passage forming substrate and a diffraction peak position B of an X-ray derived from a surface (100) of the piezoelectric layer is within the range of $2\theta = 25.487 \pm 0.1°$.

4 Claims, 3 Drawing Sheets

LIQUID JET HEAD AND AN ACTUATOR APPARATUS

BACKGROUND OF THE INVENTION

1. Field of the Invention

The present invention relates to a liquid jet head and an actuator apparatus provided with a lower electrode, a piezoelectric layer, and an upper electrode.

2. Description of Related Art

A piezoelectric element used for a liquid jet head or the like is an element provided with a piezoelectric film formed of a piezoelectric material having a function of electrical-mechanical conversion between two electrodes, and the piezoelectric film is formed of, for example, crystallized piezoelectric ceramics.

As a liquid jet head using such a piezoelectric element, for example, there is an ink jet printing head in which a part of a pressure generating chamber communicating with nozzle openings for ejecting ink droplets is formed of a vibration plate, and the vibration plate is deformed by a piezoelectric element to pressurize ink in the pressure generating chamber, thereby ejecting the ink droplets from the nozzle openings. Two kinds of ink jet printing heads has been put to practical use, one uses a vertical vibration mode actuator extending and contracting in the axial direction of a piezoelectric element, and the other uses a deflection vibration mode actuator. In such actuators, a piezoelectric element capable of obtaining a large deflection with a low driving voltage to dispose the actuators with high precision, that is, a piezoelectric element having large displacement is required.

To improve the displacement characteristics of the piezoelectric layer, the diffraction peak position of X-lay of the piezoelectric layer is restricted, for example, as described in JP-A-2006-278835.

However, even when the piezoelectric element is provided using a ferroelectric film, satisfactory displacement cannot be obtained. Such a problem is not limited to a liquid jet head represented by an ink jet printing head, and the problem also applies to another actuator in the same manner.

SUMMARY OF THE INVENTION

The invention has been made to solve at least a part of the above-described problem, and can be realized as the following aspects or application examples.

A liquid jet head includes flow passage forming substrate formed of a crystal substrate provided with a pressure generating chamber communicating with nozzle openings, and a piezoelectric element including a lower electrode, a piezoelectric layer, and an upper electrode, which are provided on the flow passage forming substrate to change the pressure in the pressure generating chamber. The piezoelectric layer has a thickness of 5 μm or less and is formed of perovskite type crystals, and the distance between the diffraction peak position of an X-ray derived from a surface (220) of the flow passage forming substrate and the diffraction peak position of an X-ray derived from a surface (100) of the piezoelectric layer is within the range of $2\theta=25.487\pm0.1°$.

Characteristics other than the above-described characteristics of the invention and parts for the purpose thereof will be clarified by reading the present specification with reference to the accompanying drawings.

BRIEF DESCRIPTION OF THE DRAWINGS

The invention will be described with reference to the following description and the accompanying drawings.

DETAILED DESCRIPTION OF PREFERRED EMBODIMENT

Figure 1:
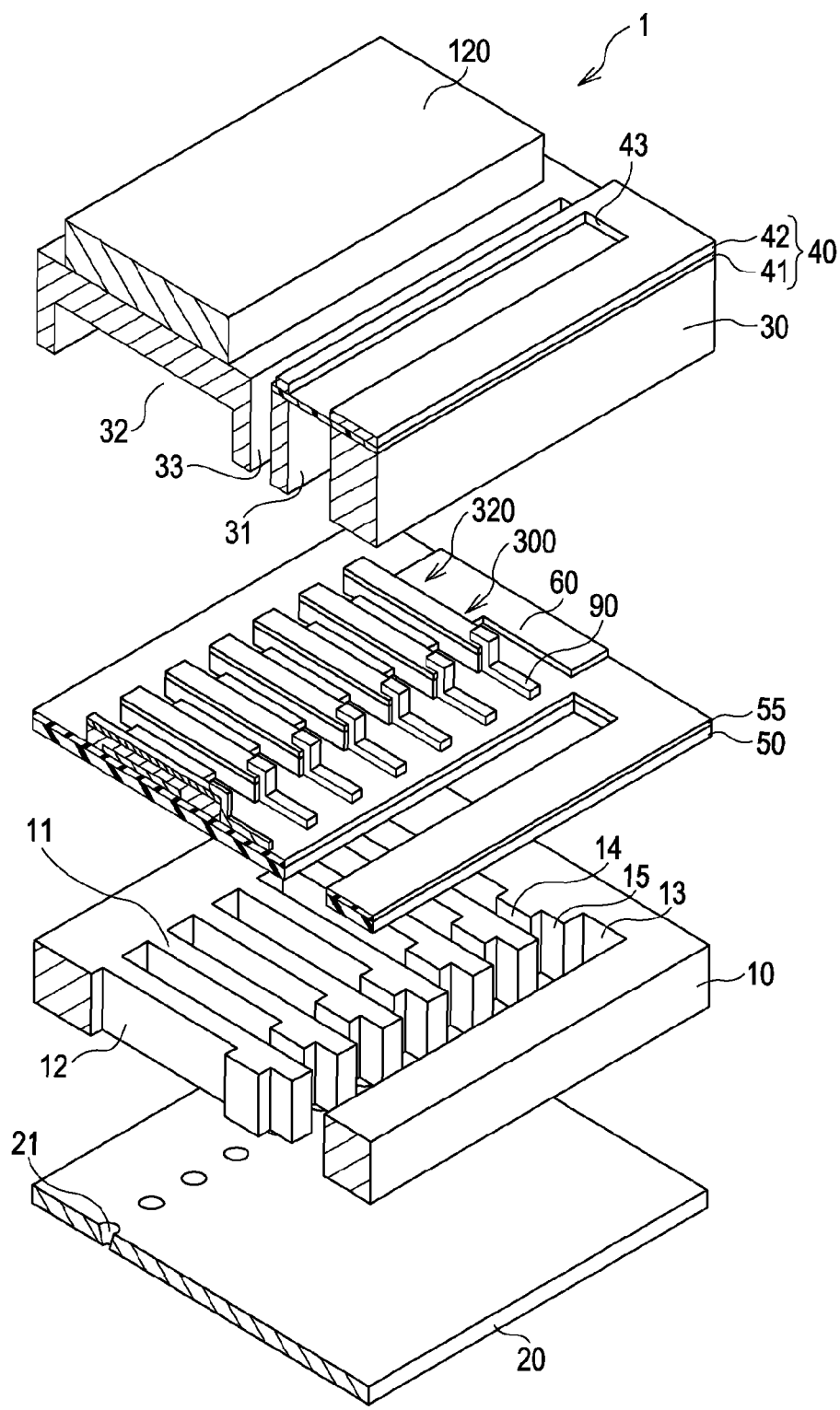
FIG. 1 is an exploded perspective view of a printing head according to Embodiment 1 of the invention.

The following are clarified by the specification and the accompanying drawings.

A liquid jet head includes a flow passage forming substrate formed of a crystal substrate provided with a pressure generating chamber communicating with nozzle openings, and a piezoelectric element including a lower electrode, a piezoelectric layer, and an upper electrode, which are provided on the flow passage forming substrate to change the pressure in the pressure generating chamber, wherein the piezoelectric layer has a thickness of 5 μm or less and is formed of perovskite type crystals, and the distance between the diffraction peak position of an X-ray derived from the surface (220) of the flow passage forming substrate and the diffraction peak position of an X-ray derived from the surface (100) of the piezoelectric layer is within the range of $2\theta=25.487\pm0.1°$.

In such an aspect, the piezoelectric layer has a predetermined crystallinity, and thus it is possible to realize a piezoelectric element capable of obtaining large displacement with low driving voltage. Accordingly, it is possible to realize a liquid jet head having excellent liquid jet characteristics.

In this case, it is preferable that a half-value width of the diffraction peak of the X-ray derived from the surface (100) of the piezoelectric layer is 0.3° or less. With such a configuration, declination of a composition ratio in a thickness direction of the piezoelectric layer, that is, declination of a crystal lattice is reduced, and thus it is possible to obtain excellent displacement characteristics.

In addition, it is preferable that the lower electrode is formed of a material mainly containing platinum, and the distance between the diffraction peak position of an X-ray derived from the surface (111) of the lower electrode and the diffraction peak position of the X-ray derived from the surface (220) of the flow passage forming substrate is within the range of $2\theta=7.411\pm0.1°$. With such a configuration, the stress of the lower electrode is within a predetermined range. Accordingly, it is possible to form a piezoelectric layer having excellent displacement characteristics on the lower electrode with crystallinity.

An actuator apparatus includes a piezoelectric element including a lower electrode formed on the crystal substrate, a piezoelectric layer having a thickness of 5 μm or less and formed of perovskite type crystals, and an upper electrode, wherein the distance between the diffraction peak position of an X-ray derived from the surface (220) of the crystal substrate and the diffraction peak position of an X-ray derived from the surface (100) of the piezoelectric layer is within the range of $2\theta=25.487\pm0.1°$.

In such an aspect, the crystallinity of the piezoelectric layer is restricted. Accordingly, it is possible to realize an actuator apparatus having a piezoelectric element capable of obtaining large displacement with low driving voltage.

Hereinafter, preferred embodiments of the invention will be described with reference to the drawings. Embodiments described hereinafter are examples of the invention, and all the described configurations are not essential constituent elements of the invention.

Preferred Embodiment

Hereinafter, embodiments will be described with reference to the drawings.

Embodiment 1

Figure 2:
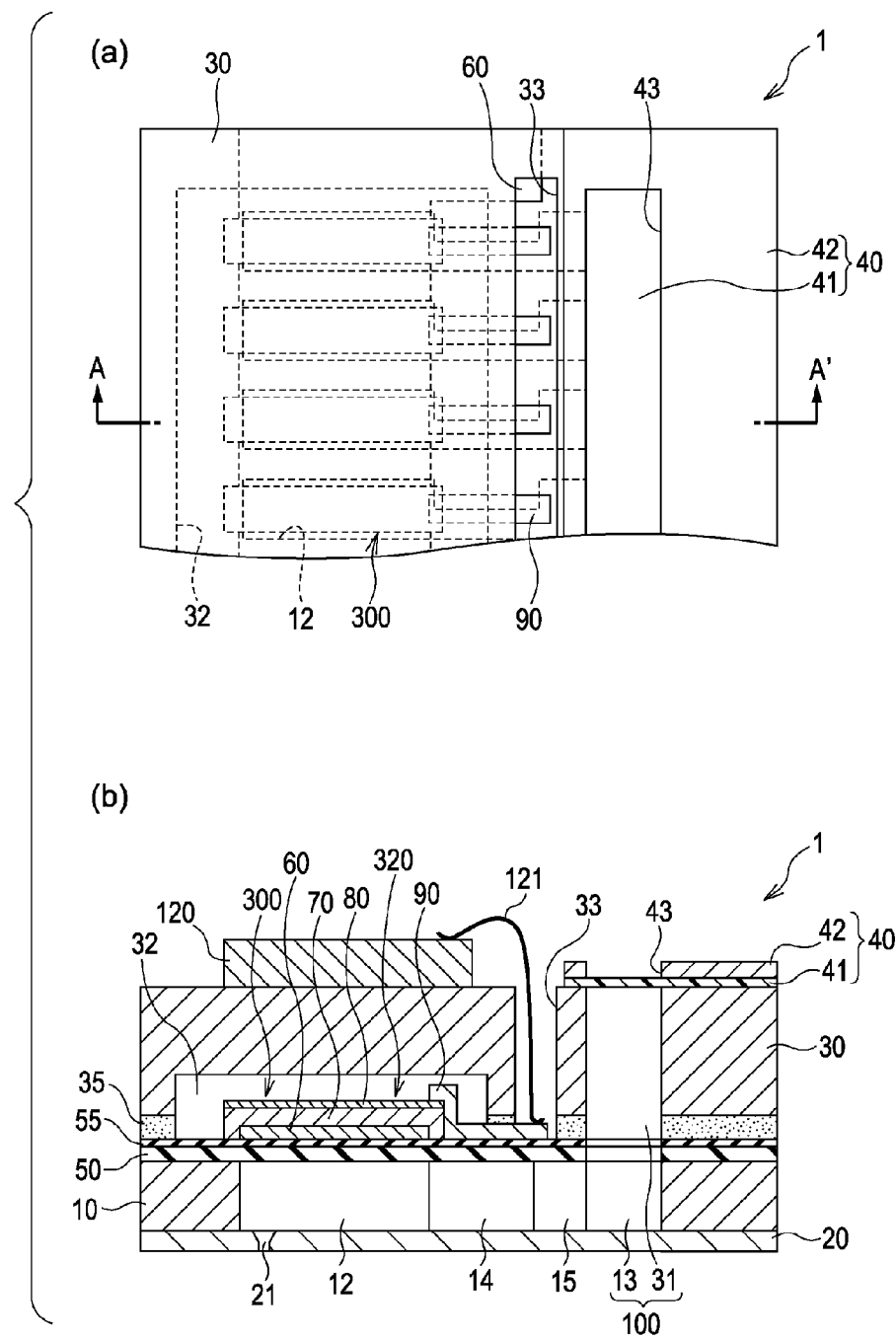
FIG. 2 is a plan view and a cross-sectional view of a printing head according to Embodiment 1 of the invention.

FIG. 1 is an exploded perspective view illustrating a schematic configuration of an ink jet printing head as an example of a liquid jet head according to the embodiment, FIG. 2(a) is a plan view of FIG. 1, and FIG. 2(b) is a cross-sectional view of A-A' shown in FIG. 2(a).

In the embodiment, a flow passage forming substrate 10 is formed of a silicon single crystal substrate in which the crystal surface orientation is to a surface (110). A elastic film 50 previously formed of silicon dioxide by thermal oxidation is formed on one surface of the flow passage forming substrate 10, and an insulating film 55 formed of zirconium dioxide ($ZrO_2$) or the like is formed on the elastic film 50.

In the flow passage forming substrate 10, pressure generating chambers 12 defined by a plurality of partition walls 11 are formed in the width direction (short side direction) by anisotropic etching from the other side. A communicating portion 13 is formed in an outward area in the long side direction of each line of the pressure generating chamber 12, and the communicating portion 13 communicates with each of the pressure generating chambers 12 through an ink supply passage 14 and a communicating passage 15 provided for each of the pressure generating chambers 12. That is, the flow passage forming substrate 10 is provided with a liquid flow passage including the pressure generating chambers 12, the communicating portion 13, the ink supply passages 14, and the communicating passages 15. The communicating portions 13 communicates with a reservoir portion 31 of a protective substrate 30 to be described later, and constitutes a part of a reservoir 100 as a common ink chamber for each line of the pressure generating chambers 12.

A nozzle plate 20 having nozzle openings 21 communicating with the vicinities of the end portions on the opposite side to the ink supply passage 14 of each pressure generating chamber 12 are fixed and attached to the opening side (the other side) of the flow passage forming substrate 10 by an adhesive agent, a thermal attaching film, or the like.

As described above, the elastic film 50 is formed on the opposite side to the opening surface of the flow passage forming substrate 10, and the insulating film 55 is formed on the elastic film 50. A lower electrode film 60, a piezoelectric layer 70, and an upper electrode film 80 are laminated and formed by film forming and lithography on the insulating film 55, thereby constituting a piezoelectric element 300. The piezoelectric element 300 means a part including the lower electrode film 60, the piezoelectric layer 70, and the upper electrode film 80. Generally, any one electrode of the piezoelectric element 300 is used as a common electrode, and the other electrode and the piezoelectric layer 70 are formed by patterning for each pressure generating chamber 12. A part, which includes the one patterning-processed electrode and the piezoelectric layer 70 and in which piezoelectric deflection is generated by applying voltage to both electrodes, is called a piezoelectric active portion 320. In the embodiment, the lower electrode film 60 is used as a common electrode of the piezoelectric element 300, and the upper electrode 80 is used as a separate electrode of the piezoelectric element 300. However, they may be inverted to each other by a driving circuit or wiring. Herein, the piezoelectric element 300 and a vibration plate in which displacement is generated by driving the piezoelectric element 300 are integrally called an actuator apparatus. In the above-described example, the elastic film 50, the insulating film 55, and the lower electrode film 60 serve as the vibration plate, but not limited thereto. For example, only the lower electrode film 60 may serve as the vibration plate without the elastic film 50 and the insulating film 55. The piezoelectric element 300 may also substantially serve as the vibration plate.

As the piezoelectric layer 70 according to the embodiment, for example there is a crystal film (perovskite type crystal) having a perovskite structure formed of a material of ferroelectric ceramics representing an electrical-mechanical conversion operation and formed on the lower electrode film 60. As preferable materials for the piezoelectric layer 70, there is a ferroelectric piezoelectric material such as lead zirconate titanate (PZT), or a material in which metal oxide such as niobium oxide, nickel oxide, and magnesium oxide is added thereto. Specifically, lead titanate ($PbTiO_3$), lead zirconate titanate ($Pb(Zr, Ti)O_3$), lead zirconate ($PbZrO_3$), lead lanthanum titanate (($Pb, La), TiO_3$), lead lanthanum zirconate titanate (($Pb, La) (Zr, Ti)O_3$), lead zirconate titanate magnesium niobium ($Pb(Zr, Ti) (Mg, Nb)O_3$), or the like may be used. In the embodiment, lead zirconate titanate (PZT) was used as the piezoelectric layer 70. The thickness of the piezoelectric layer 70 was suppressed so as not to generate cracks in the production process, and the piezoelectric layer 70 was formed of a thickness to represent sufficient displacement characteristics. In the embodiment, for example, the piezoelectric layer 70 was formed with a thickness of 5 μm or less.

Figure 3:
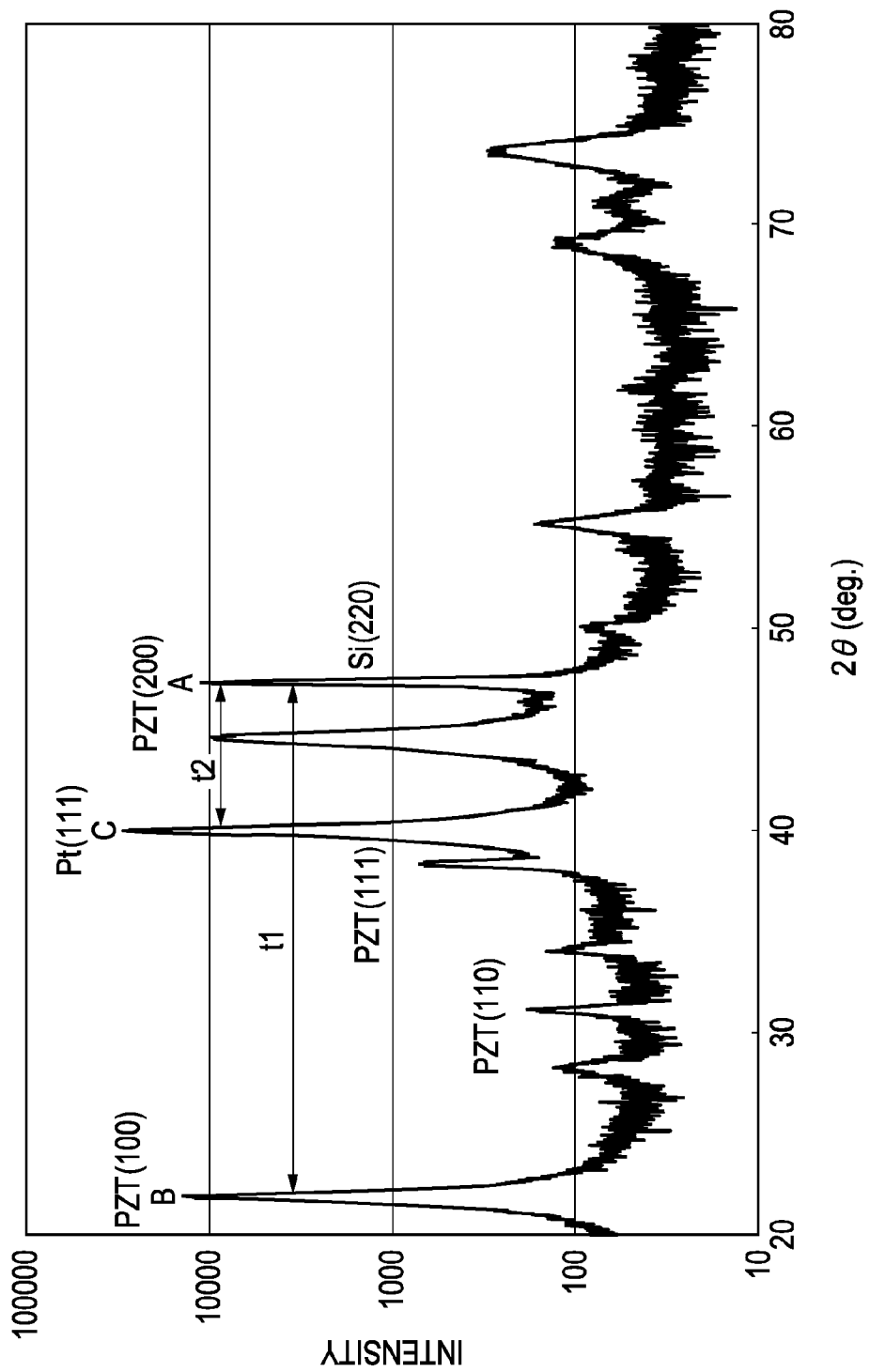
FIG. 3 is a graph illustrating a measurement result according to Embodiment 1 of the invention.

As shown in FIG. 3, the piezoelectric layer 70 is formed so that a distance t1 between a diffraction peak position A of an X-ray derived from a surface (220) of the flow passage forming substrate 10 and a diffraction peak position B of an X-ray derived from a surface (100) of the piezoelectric layer 70, measured according to an X-ray diffraction wide-angle method (XRD) is within the range of $2\theta = 25.487 \pm 0.100°$.

As described above, the diffraction peak position B of the X-ray of the surface (100) of the piezoelectric layer 70 is set to have a predetermined relationship with the diffraction peak position A of the surface (220) of the flow passage forming substrate 10, and thus it is possible to obtain the piezoelectric layer 70 capable of obtaining large displacement with low driving voltage, that is, having excellent displacement characteristics and suppressing decrease in displacement by repeated driving.

In the piezoelectric layer 70 according to the embodiment, the half-value width of the diffraction peak of the X-ray derived from the surface (100) measured according to the X-ray diffraction wide-angle method (XRD) is 0.3° or less. When the piezoelectric layer 70 is measured according to the X-ray diffraction wide-angle method, a peak of a diffraction intensity corresponding to the surface (100) the surface (110), the surface (111), and the like is generated. The "half-value width" means a width of a half value of a peak intensity corresponding to each crystal surface of a rocking curve shown in an X-ray diffraction chart (FIG. 3) measured by the X-ray diffraction wide-angle method.

The half-value width of the surface (100) represents the deviation of a crystal lattice of the piezoelectric layer 70 in a thickness direction. The displacement characteristics of the piezoelectric layer 70 on the side, where the size of the crystal lattice of the piezoelectric layer 70 in the thickness direction is corrected, are excellent. Accordingly, it is preferable that the half-value width of the surface (100) representing the deviation of the size of the crystal lattice of the piezoelectric layer 70 is as small as possible.

As described above, the half-value width of the surface (100) of the piezoelectric layer 70 is 0.3° or less, and thus the declination of the composition ratio of the piezoelectric layer 70 in the thickness direction, that is, the declination of the crystal lattice, is reduced. Accordingly, it is possible to obtain excellent displacement characteristics.

The lower electrode film 60 according to the embodiment is formed of a material mainly containing platinum (Pt). As shown in FIG. 3, a distance t2 between a diffraction peak position C of an X-ray derived from the surface (111) of the lower electrode film 60 and a diffraction peak position A of an X-ray derived from the surface (220) of the flow passage forming substrate measured according to the X-ray diffraction wide-angle method is within the range of $2\theta = 7.411 \pm 0.1°$.

As described above, the diffraction peak position C of the surface (111) of the lower electrode film 60 is set within the predetermined range, and thus it is possible to adjust the stress of the lower electrode film 60. Accordingly, it is possible to form the piezoelectric layer 70 on the lower electrode film 60 so that the $2\theta$ of the diffraction peak position of the surface (100) or the half-value width is within the above-described range. That is, the stress of the lower electrode film 60 has an influence on the crystallinity of the piezoelectric layer 70 formed thereon, and thus it is possible to form the piezoelectric layer 70 having excellent displacement characteristics with regard to the crystallinity by setting the stress of the lower electrode film 60 within the predetermined range.

The piezoelectric layer 70 may be formed by a sol-gel method, an MOD (Metal-Organic Decomposition) method, a sputtering method, or a PVD (Physical Vapor Deposition) method such as a laser abrasion method. In addition, it is possible to form the piezoelectric layer 70 with the above-described crystal characteristics, for example, by adjusting the composition of sol or the heat treatment temperature at production time.

The piezoelectric layer 70 may be aligned with priority on any one of the surface (100), the surface (110), and the surface (111), and the crystal structure thereof may be any one of a rhombohedral crystal system, a tetragonal crystal system, and a monoclinic crystal system. As shown in FIG. 3, the piezoelectric layer 70 according to the embodiment is aligned with priority on the surface (100). As described above, the piezoelectric layer 70 aligned on the surface (100) with priority has excellent displacement characteristics capable of obtaining large displacement with low driving voltage, and is suitable for use as an ink jet printing head 1. In addition, to align the piezoelectric layer 70 on the surface (100) or the surface (110) with priority, an alignment control layer having a predetermined crystal alignment may be provided on the lower side or the upper side of the lower electrode film 60, titanium for invalidating the alignment of the lower electrode film 60 may be provided on the lower electrode film 60, and the heat treatment temperature at the time of forming the piezoelectric layer 70 or the like may be adjusted.

Examples 1 to 3

As a base before forming the piezoelectric layer 70, the lower electrode 60 was provided by sequentially laminating an attachment layer formed of titanium (Ti) on the flow passage forming substrate 10, a platinum layer formed of platinum (Pt) on the attachment layer, an iridium layer formed of iridium (Ir) on the platinum layer, and a crystal seed layer formed of titanium (Ti) on the iridium layer, and the piezoelectric layer 70 was formed on the lower electrode film 60 by the sol-gel method. Specifically, the method of forming the piezoelectric layer 70 is to apply sol (applied solution) including the organic matter that is the material for forming the piezoelectric layer 70 onto the surface of the flow passage forming substrate 10 on the lower electrode film 60 side. In Examples 1 to 3, the sol (applied solution) was applied by a spin-coat method, and it was rotated for 30 to 60 seconds after the completion of the application to stabilize the film thickness of the sol. Next, the applied solution was heated at a predetermined temperature and dried for a predetermined time, thereby forming a piezoelectric precursor film. In Examples 1 to 3, it was heated at $100 \pm 10°$ C. for 3 minutes and dried in a first drying process, and then it was heated at $160 \pm 10°$ C. for 3 minutes and dried in a second drying process. Next, the dried piezoelectric precursor film was heated at a predetermined temperature and was kept for a predetermined time, thereby defatting it (defatting process). In the embodiment, the dried piezoelectric precursor film was heated at $380 \pm 15°$ C. for 3 minutes, thereby defatting it. Herein, the defatting means that organic components included in the piezoelectric precursor film are removed by, for example, $NO_2$, $CO_2$, $H_2O$, or the like, and that a piezoelectric precursor film is formed so as not to crystallize, that is, an amorphous piezoelectric precursor film is formed. Next, the defatted piezoelectric precursor film was heated at a predetermined temperature, and was kept for a predetermined time in order to crystallize it, thereby forming the piezoelectric layer 70 (burning process). In the embodiment, the defatted piezoelectric precursor film was heated at $737 \pm 30°$ C. for 5 minutes to burn the piezoelectric precursor film, thereby forming the piezoelectric layer 70. Under these production conditions, three piezoelectric layers 70 were produced, and they became Examples 1 to 3. The upper electrode film 80 was formed on the piezoelectric layers 70 of Examples 1 to 3, and the pressure generating chamber 12 and the like were formed at the flow passage forming substrate 10.

Comparative Examples 1 and 2

Two piezoelectric layers were produced under production conditions, at least a part of which were different from the above-described production conditions of Examples 1 to 3, and they became Comparative Examples 1 and 2.

Test Example 1

The piezoelectric layers of Examples 1 to 3 and Comparative Examples 1 and 2 were measured according to the X-ray diffraction wide-angle method (XRD). In the X-ray diffraction wide-angle method according to the embodiment, the measurement was performed under the conditions where a light source is Cu—Kα, a main wavelength is 1.541838 Å, a scanning speed is 2°/min, a distance (resolution) of θ at the time of scanning is 0.02°; using an X-ray diffraction device (GXR300: made by Rigaku Corporation). The result is shown in Table 1.

Displacement of initial driving (initial displacement) of the piezoelectric elements of Examples 1 to 3 and Comparative Examples 1 and 2, and displacement (decrease in displacement) after repeated driving were measured, and difference between the initial displacement and the decrease of displacement was compared and determined. The result is shown in Table 1.

TABLE 1

| | t1 (100)-(220) | Initial Displacement | Decrease in Displacement (Permanent Set) | Assessment |
|---|---|---|---|---|
| Comparative Example 1 | 25.330 | Δ | ○ | Δ |
| Example 1 | 25.387 | ○ | ○ | ○ |
| Example 2 | 25.487 | ○ | ○ | ○ |
| Example 3 | 25.587 | ○ | ○ | ○ |
| Comparative Example 2 | 25.630 | ○ | Δ | Δ |

As shown in Table 1, in Examples 1 to 3 in which the distance t1 between the diffraction peak position A of the X-ray derived from the surface (220) of the flow passage forming substrate 10 and the diffraction peak position B of the X-ray derived from the surface (100) of the piezoelectric layer 70 is $2\theta=25.487\pm0.1°$, it was evident that displacement of the initial driving is excellent, and decrease in displacement (permanent set) caused by repeated driving is small. On the contrary, in Comparative Example 1 in which the distance t1 is smaller than $2\theta=25.387°$, the initial displacement is small, and in Comparative Example 2 in which the distance t1 is larger than $2\theta=25.587°$, the decrease in displacement is large.

Accordingly, as described above, in the piezoelectric element 300 using the piezoelectric layer 70 in which the distance t1 between the diffraction peak position A of the X-ray derived from the surface (220) of the flow passage forming substrate 10 and the diffraction peak position B of the X-ray derived from the surface (100) of the piezoelectric layer 70 is within the range of $2\theta=25.487\pm0.1°$, the initial displacement is excellent and the decrease in displacement is small.

A lead electrode 90 is connected to each upper electrode film 80 as a separate electrode of the piezoelectric element 300. The lead electrode 90 is drawn out of the vicinity of the end portion close to the ink supply passage 14, is formed of, for example, gold (Au), and extends to the upper portion of the insulating film 55.

The protective substrate 30 having the reservoir portion 31 constituting at least a part of the reservoir 100 is adhered onto the flow passage forming substrate 10 on which the piezoelectric element 300 is formed, that is, onto the lower electrode film 60, the insulating film 55, and the lead electrode 90, through an adhesive agent 35. In the embodiment, the reservoir portion 31 is formed in the width direction of the pressure generating chamber 12 by penetrating the protective substrate 30 in the thickness direction. As described above, the reservoir 31 communicating with the communicating portion 13 of the flow passage forming substrate 10 constitutes the reservoir 100 which is the common ink chamber of each pressure generating chamber 12. The communicating portion 13 of the flow passage forming substrate 10 may be divided into a plurality of parts for each pressure generating chamber 12, and thus only the reservoir portion 31 may be used as the reservoir. For example, the flow passage forming substrate 10 may be provided with only the pressure generating chamber 12, and a member (e.g., the elastic film 50, the insulating film 55, etc.) interposed between the flow passage forming substrate 10 and the protective substrate 30 may be provided with the ink supply passage 14 communicating with the reservoir and each pressure generating chamber 12.

In an area opposed to the piezoelectric element 300, the protective substrate 30 is provided with a piezoelectric element holding portion 32 having space to a degree that movement of the piezoelectric element 300 is not obstructed. In addition, the piezoelectric element holding portion 32 may have space to the degree that the movement of the piezoelectric element 300 is not obstructed, and the space may be sealed up or not be sealed up.

The protective substrate 30 is provided with a penetration opening 33 penetrating the protective substrate 30 in the thickness direction. The vicinity of the end portion of the lead electrode 90 drawn out of each piezoelectric element 300 is provided to be exposed in the penetration opening 33.

A driving circuit 120 serving as a signal processing unit is fixed onto the protective substrate 30. As the driving circuit 120, for example, a circuit board, a semiconductor integrated circuit (IC), or the like may be used. The driving circuit 120 and the lead electrode 90 are electrically connected to each other through a connection wiring 121 formed of a conductive wire such as a bonding wire passing through the penetration opening 33.

As the protective substrate 30, it is preferable to use a material having substantially the same thermal expansion rate as that of the flow passage forming substrate 10, for example, glass, ceramic material, or the like. In the embodiment, the protective substrate was formed using a silicon single crystal substrate of the surface orientation (110) formed of the same material as that of the flow passage forming substrate 10.

A compliance substrate 40 including a sealing film 41 and a fixing plate 42 is bonded onto the protective substrate 30. The sealing film 41 is formed of a material having low rigidity and having flexibility, for example, a polyphenylene sulfide (PPS) film. One surface of the reservoir portion 31 is sealed up by the sealing film 41. The fixing plate 42 is formed of a rigid material such as metal, for example, stainless steel (SUS). An area of the fixing plate 42 opposed to the reservoir 100 is formed of an opening portion 43, which is completely hollow in the thickness direction, and thus one surface of the reservoir 100 is sealed only by the flexible sealing film 41.

In the ink jet printing head 1 according to the embodiment, ink is introduced from an ink inlet connected to an external ink supply unit (not shown), the inside is filled with ink from the reservoir 100 to the nozzle openings 21, voltage is applied between the upper electrode film 80 and the lower electrode film 60 corresponding to the pressure generating chamber 12 according to a printing signal transmitted from the driving circuit 120, and the elastic film 50, the insulating film 55, lower electrode film 60, and the piezoelectric layer 70 are curved and deformed, thereby raising pressure in each pressure generating chamber 12 and ejecting ink droplets from the nozzle openings 21.

In the embodiment, the ink jet printing head 1 is provided with the piezoelectric element 300 having the piezoelectric layer 70 with the excellent displacement characteristics, and thus it is possible to realize the ink jet printing head 1 possessing improved ink ejecting characteristics such as an ejecting rate and weight of ink droplets, with a low driving voltage.

Other Example

The embodiment has been described above, but the basic configuration of the invention is not limited to the above description. For example, in Embodiment 1 described above, the material mainly containing platinum (Pt) was used as the lower electrode film 60 by way of example, but the invention is not limited particularly thereto. For example, an attachment layer formed of a material other than platinum to improve the close attachment property may be provided on the lowest layer of the lower electrode film 60 close to the insulating film 55. A diffusion preventing layer for preventing the component of the lower electrode film 60 from being diffused into the piezoelectric layer 70 and preventing the component of the piezoelectric layer 70 from being diffused into the lower electrode film 60 may be provided as the lower electrode film 60. In addition, as the material of the attachment layer, for example, there are titanium (Ti), zirconium (Zr), tantalum (Ta), tungsten (W) nickel (Ni), hafnium (Hf), niobium (Nb), molybdenum (Mo), and cobalt (Co). As the material of the diffusion preventing layer, for example, there are iridium (Ir) palladium (Pb), rhodium (Rh), ruthenium (Ru), osmium (Os) oxides thereof, and the like.

In Embodiment 1 described above, the ink jet printing head has been described as an example of the liquid jet head, but the scope of the invention is wide enough to cover all liquid jet heads and can be applied to a liquid jet head ejecting liquid other than ink. As the other liquid jet heads, for example, there are various printing heads used for image printing apparatuses such as printers, chromatic material jet heads used for producing color filters of liquid crystal displays or the like, electrode material jet heads used for forming electrodes of organic EL displays, FED (field emitting displays), or the like, bio-organic matter jet heads used for producing biochips, and the like.

The invention is not limited to an actuator apparatus mounted on a liquid jet head represented by an ink jet printing head, and can be applied to an actuator apparatus mounted on the other apparatuses.

The invention is:

1. A liquid jet head comprising:
 a flow passage forming substrate formed of a crystal substrate provided with a pressure generating chamber communicating with nozzle openings; and
 a piezoelectric element including a lower electrode, a piezoelectric layer, and an upper electrode, which are provided on the flow passage forming substrate to change pressure in the pressure generating chamber,
 wherein the piezoelectric layer has a thickness of 5 µm or less and is formed of perovskite type crystals, and the distance between a diffraction peak position of an X-ray derived from a surface (220) of the flow passage forming substrate and a diffraction peak position of an X-ray derived from a surface (100) of the piezoelectric layer is within the range of $2\theta=25.487\pm0.1°$.

2. The liquid jet head according to claim 1, wherein a half-value width of the diffraction peak of the X-ray derived from the surface (100) of the piezoelectric layer is 0.3° or less.

3. The liquid jet head according to claim 1, wherein the lower electrode is formed of a material mainly containing platinum, and the distance between the diffraction peak position of an X-ray derived from a surface (111) of the lower electrode and the diffraction peak position of an X-ray derived from the surface (220) of the flow passage forming substrate is within the range of $2\theta=7.411\pm0.1°$.

4. An actuator apparatus comprising:
 a piezoelectric element including a lower electrode formed on the crystal substrate, a piezoelectric layer having a thickness of 5 µm or less and formed of perovskite type crystals, and an upper electrode,
 wherein the distance between a diffraction peak position of an X-ray derived from a surface (220) of the crystal substrate and a diffraction peak position of an X-ray derived from a surface (100) of the piezoelectric layer is within the range of $2\theta=25.487\pm0.1°$.

* * * * *